United States Patent
Comita et al.

(10) Patent No.: US 6,774,040 B2
(45) Date of Patent: Aug. 10, 2004

(54) APPARATUS AND METHOD FOR SURFACE FINISHING A SILICON FILM

(75) Inventors: Paul B. Comita, Menlo Park, CA (US); Karin Anna Lena Thilderkvist, San Jose, CA (US); Lance Scudder, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 48 days.

(21) Appl. No.: 10/243,790

(22) Filed: Sep. 12, 2002

(65) Prior Publication Data

US 2004/0053515 A1 Mar. 18, 2004

(51) Int. Cl.$^7$ ............................................. H01L 21/302
(52) U.S. Cl. ...................... 438/689; 438/695; 438/623; 438/677; 438/763; 438/706; 438/719; 438/734; 438/964; 438/977
(58) Field of Search ................................ 438/689, 695, 438/623, 677, 763, 706, 719, 734, 964, 977

(56) References Cited

U.S. PATENT DOCUMENTS

| | | | |
|---|---|---|---|
| 3,945,864 A | | 3/1976 | Goldsmith et al. |
| 4,842,897 A | * | 6/1989 | Takeuchi et al. ........ 427/255.35 |
| 5,403,434 A | | 4/1995 | Moslehi |
| 5,445,710 A | * | 8/1995 | Hori et al. .................. 438/717 |
| 5,968,279 A | | 10/1999 | MacLeish et al. |
| 6,008,128 A | | 12/1999 | Habuka et al. |
| 6,107,197 A | | 8/2000 | Suzuki |
| 6,171,965 B1 | | 1/2001 | Kang et al. |
| 6,287,941 B1 | | 9/2001 | Kang et al. |
| 6,391,796 B1 | | 5/2002 | Akiyama et al. |
| 6,489,241 B1 | * | 12/2002 | Thilderkvist et al. ........ 438/689 |
| 6,562,720 B2 | * | 5/2003 | Thilderkvist et al. ........ 438/695 |
| 2002/0090818 A1 | * | 7/2002 | Thilderkvist et al. ........ 438/689 |
| 2003/0232495 A1 | * | 12/2003 | Moghadam et al. ......... 438/623 |

OTHER PUBLICATIONS

Hitoshi Habuka et al., "Change in Microroughness of a Silicon Surface during In Situ Cleaning Using HF and HCl Gases," J. Electrochem Soc. vol. 145, Dec. 1998, The Electrochemical Society, Inc., pp. 4264–4272.

Michel Bruel, "The History, Physics and Applications of the Smart–Cut Process," MRS Bulletin, Dec. 1998, pp. 35–43.

Jean–Pierre Colinge, et al., "Silicon–on–Insulator Technology," MRS Bulletin, Dec. 1998, pp. 13–23.

Steve Krause, et al., "Evolution and Future Trends of SIMOX Material," MRS Bulletin, Dec. 1998, pp. 25–33.

William G. En, et al., "The Genesis Process: A New SOI Wafer Fabrication Method," Proceeding 1998 IEEE International SOI Conference, Oct. 1998, pp. 163–164.

* cited by examiner

Primary Examiner—Matthew Smith
Assistant Examiner—V. Yevsikov
(74) Attorney, Agent, or Firm—Blakely Sokoloff Taylor & Zafman

(57) ABSTRACT

A method of treating a silicon surface of a substrate that includes heating the substrate in a process chamber to a temperature, exposing a first area adjacent to the silicon surface to a first gas mixture comprising an etchant, a silicon source gas, and a carrier, exposing a second area adjacent to the silicon surface to a second gas mixture, wherein the second gas mixture is different from the first gas mixture.

38 Claims, 10 Drawing Sheets

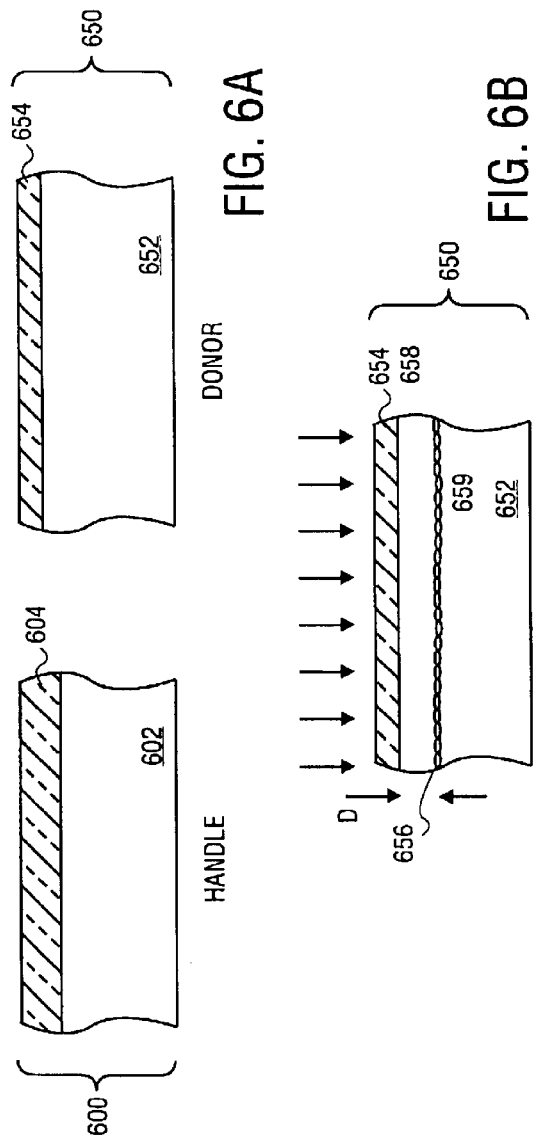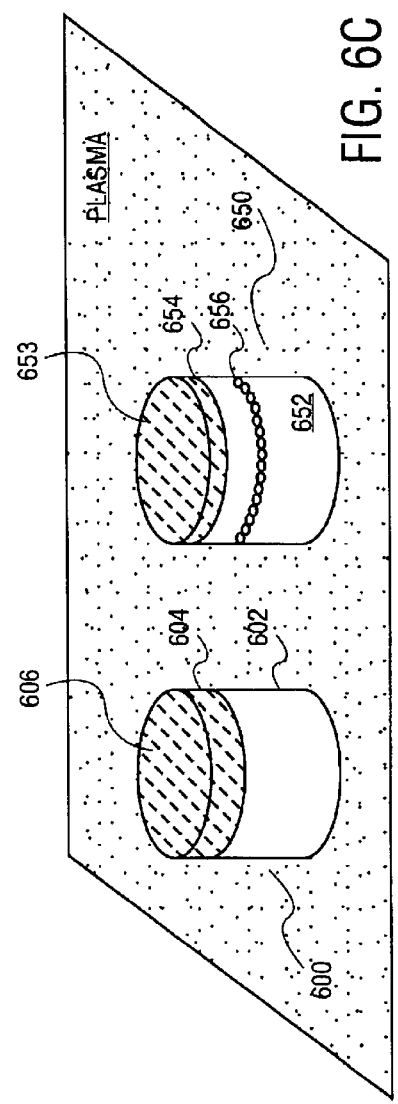

APPARATUS AND METHOD FOR SURFACE FINISHING A SILICON FILM

BACKGROUND OF THE INVENTION

1. Field of the Invention

The present invention relates to the field of semiconductor processing and more specifically to a method and apparatus for smoothing and adding silicon to a silicon or silicon alloy surface.

2. Discussion of Related Art

Semiconductor devices such as microprocessors and memories are fabricated by various steps including the deposition and removal of silicon films. Silicon deposition and removal steps as well as other process steps can cause the surface of silicon films to become rough and contaminated. Rough and contaminated silicon surfaces can generally lead to poor quality interfaces, which can lead to poor device performance and reliability. It would therefore be desirable to be able to accurately, reliably, and uniformly treat a silicon surface in order to remove any surface contaminants contained therein and to provide a smooth silicon surface finish. It would also be desirable to be able to treat a silicon surface in a chamber, which could subsequently be used to deposit a silicon film. In this way after removing the surface contaminants and smoothing the silicon surface one could directly deposit a silicon film onto the uncontaminated smooth silicon surface without exposing the treated surface to an oxidizing or contaminating environment.

SUMMARY OF THE INVENTION

A method and apparatus for treating a silicon surface is disclosed. As part of the method and apparatus, a substrate having a silicon or silicon alloy surface can be placed into a process chamber and heated to a temperature of approximately between 700°–1300° C. While the substrate is heated, the silicon surface can be exposed to a combination of process gasses, where the process gasses can include a first gas mixture of a silicon etchant mixed with a silicon source gas and disposed in a carrier gas. The first gas mixture can flow into the process chamber at one or more locations. A second gas mixture may flow into the process chamber at one or more locations that are different from the locations for the first gas mixture. The second gas mixture may use the same etchant, silicon source gas, and carrier gas as the first gas mixture but may be applied at different concentrations and/or flow rates into the process chamber. The etchant can be, for example, HCl, the silicone source gas can be, for example, silane gas, and the carrier gas can be for example, hydrogen gas. The first gas mixture and the second gas mixture can be pre-mixed. The first and second gas mixtures can flow through two or more separate channels into the process chamber to be applied onto a spinning wafer. As a result of the channels, the process gases can be applied onto the silicon surface where the first gas mixture can flow to a first area over the wafer that is different from a second area over the wafer where the second gas mixture flows. The process can provide for uniform smoothing of an exposed silicon surface and the process can provide for silicon to be uniformly added to the silicon surface.

BRIEF DESCRIPTION OF THE DRAWINGS

FIG. 6A is an illustration of a handle wafer and a donor wafer.

FIG. 6B is an illustration showing the ion implantation of hydrogen into the donor wafer to form a dislocation therein.

FIG. 6C is an illustration showing the plasma activation of the donor and handle wafers.

DETAILED DESCRIPTION OF THE PRESENT INVENTION

Figure 1:
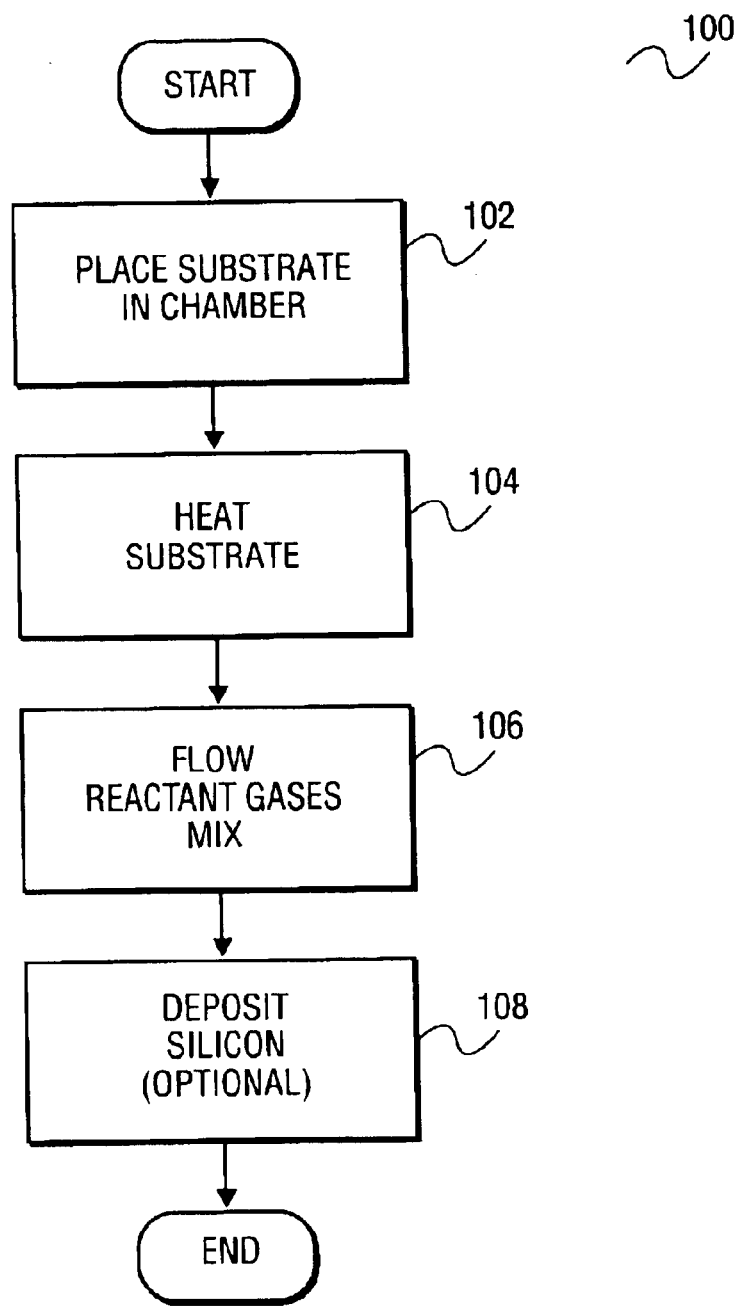
FIG. 1 is a flow chart showing a method of treating a silicon film in accordance with the present invention.

A method and apparatus for treating or finishing a silicon surface is described. In the following description numerous specific details are set forth in order to provide a thorough understanding of the present invention. One skilled in the art will appreciate that these specific details are not necessary in order to practice the present invention. In other instances, well known equipment features and processes have not been set forth in detail in order to avoid obscuring the present invention.

The method and apparatus described is for finishing or treating a silicon or silicon alloy surface by uniformly smoothing the surface and removing contaminants contained therein. The method and apparatus can uniformly add silicon material to the silicon or silicon alloy top surface of a substrate. Such uniformity for surface smoothing and for adding silicon material can be accomplished by using multiple ports to simultaneously flow more than one gas mixture having different compositions (i.e. different chemicals and/or different chemical concentrations) and at different flow rates into a process chamber. The different compositions and the different flow rates can compensate for such parameters as a higher angular velocity of the surface of a spinning wafer that exists at the outer edge than near the center or for the larger surface area that exists on the wafer near the outer edge than towards the wafer center and for a the temperature distribution that exists radially towards the wafer edge. By using more than one stream, each stream flowing from one of the multiple ports and where each stream can have different chemistry, such variables as described above can be compensated for.

In one embodiment, the substrate having the silicon top surface can be placed into the process chamber and heated to a temperature that can be approximately between 700° and 1300° C. While the substrate such as, for example a wafer, is heated, the silicon surface can be exposed to process gases that can be a mixture of active ingredients disposed in a carrier gas. One active ingredient can be an etchant to the silicon surface, such as, for example, hydrochloric acid (HCl). The etchant can remove silicon from the silicon surface. In addition, while the substrate is heated, the silicon surface can be exposed to another active ingredient in the carrier gas that can be a source of silicon, such as, for example, silane gas. The etchant and the silicon source gases can be premixed into a number of different concentrations.

A multiple gas delivery system (gas panel) can perform the mixing and can supply the mixtures at a number of different flow rates into the process chamber. This can be accomplished by having the gas panel supply the different mixtures and/or mixture concentrations at different flow rates to a number of different channels where the channels can feed into different ports in the process chamber. The ports can direct the flows of process gases onto different zones or areas that are above the substrate. As a result, different mixtures and/or mixture concentrations can be applied at different flow rates onto different areas of the silicon surface to provide process uniformity.

The silicon source gas can be a chemical that provides silicon atoms in sufficient numbers to meet the process demands. Silicon source gases can be such chemicals as, for example, dichlorosilane ($SiCl_2H_2$), trichlorosilane ($SiCl_3H$, silicon tetrachloride $SiCl_4$, silane ($SiH_4$), disilane ($Si_2H_6$) and others having an appropriate silicon deposition precursor. The application of the silicon source gas, at temperature, can add silicon (Si) material to the silicon substrate surface. The added silicon material preferentially fills in the valleys more than the peaks in the treated surface, which can result in improved surface smoothing.

The application of the silicon source gas can be done under parameters that can add to the material thickness of silicon film relative to the silicon film thickness before the smoothing process. Alternatively, the application of the silicon source material may only replace some or all of the silicon that was lost to the HCl etch. As a result, while the silicon surface is being smoothed, a combination of etchant and silicon source gas can provide a silicon layer with any desired uniform thickness.

The relatively high temperatures used during the surface treatment is sufficient to increase silicon mobility and thereby cause silicon in high areas or peaks to migrate to low areas or valleys in the film. Simultaneous with the silicon migration, the active ingredients can remove the tops of the silicon surface resulting in a smoothing of the silicon surface and removal of contaminants contained therein. As a result, smoothing of the silicon or silicon alloy surface can achieve a surface roughness of less than 0.1 nm RMS from a beginning surface roughness of 6 nm RMS or more. Such smoothing can occur with no loss in silicon coating thickness or, alternately, with an increase in the silicon coating thickness.

In one embodiment, the silicon smoothing process can be integrated into a $H_2$ cleave process used to form a silicon-on-insulator (SOI) substrate. A rough surface that has been created by the cleaving process can then be smoothed during the fabrication of the SOI substrate.

Figure 2A:
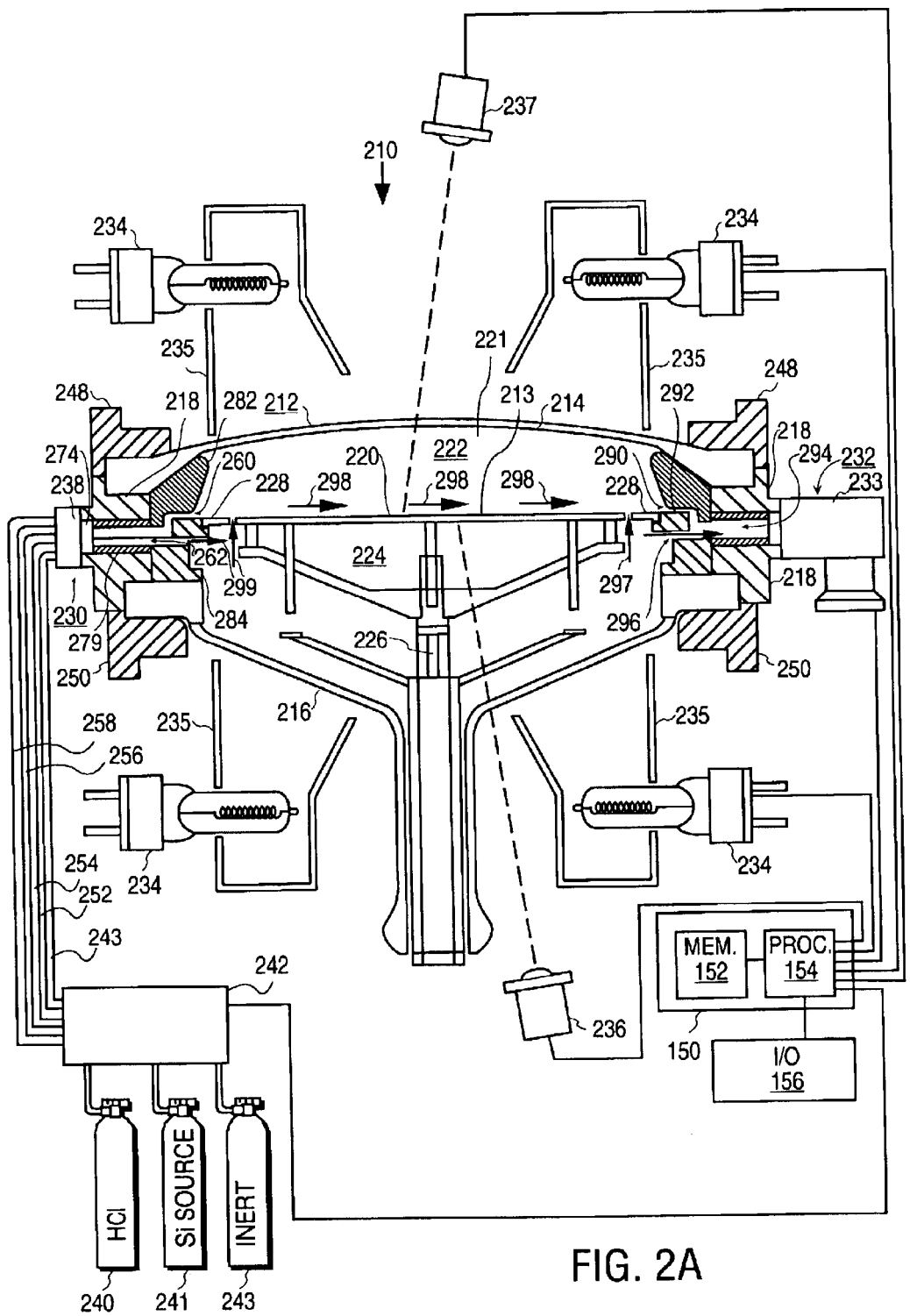
FIG. 2A is an illustration of a processing apparatus, which can be utilized to treat a silicon film in accordance with the present invention.

FIG. 1 is a flow chart 100, which describes a method of finishing or treating a silicon or silicon alloy surface. FIG. 2A is an illustration of a thermal processing apparatus in which the method described can be implemented. An example of such a process apparatus 210 can be, for example, the Applied Materials single wafer atmospheric "EPI" tool known as the "EPI Centura".

The processing apparatus 210 shown in FIG. 2A can be a wafer deposition reactor comprising a process chamber that can include a deposition chamber 212 having an upper dome 214, a lower dome 216 and a sidewall 218 between the upper and lower domes 214 and 216. Cooling fluid (not shown) can be circulated through the sidewall 218 in order to cool O-rings (not shown) used to seal the domes 214 and 216 against the sidewall 218. An upper liner 282 and a lower liner 284 can be mounted against an inside surface of the sidewall 218. The upper and lower domes 214 and 216 can be made of a transparent material to allow heating light to pass through into the deposition chamber 212.

Within the process chamber 212 can be a flat circular susceptor 220 for supporting a wafer 213 in a horizontal position. The susceptor 220 can extend transversely across the process chamber 212 at the sidewall 218 to divide the chamber 212 into an upper portion 222 above the susceptor 220 and a lower portion 224 below the susceptor 220. The susceptor 220 can be mounted on a shaft 226, which can extend perpendicularly downward from the center of the bottom of the susceptor 220. The shaft 226 can be connected to a motor (not shown), which can rotate the shaft 226 and thereby rotate the susceptor 220. An annular preheat ring 228 can be connected at an outer periphery of the annular preheat ring 228 and an inside periphery of the lower liner 284. The preheat ring 228 can be in the same plane as the susceptor 220 with an inner edge of the pre-heat ring 228 separated by a gap 297 formed with an outer edge of the susceptor 220.

An inlet manifold 230 can be positioned in the side of the chamber 212 and the inlet manifold 230 can be adapted to accept gasses 243, 252, 254, 256, and 258 from a gas panel 242. The gases delivered into the process chamber 212 from the gas panel 242 can be the inert gas 243 acting as a purge. Alternately, the gasses delivered can be mixtures 252, 254, 256, and 258, which can include, for example, the inert gas 243 acting as a carrier gas and one or more of the reactive gasses 240 or 241. It is to be appreciated that the gas panel 242 can mix and deliver into the process chamber 222, any number of reactive gasses in addition to the silicon etchant 240 and silicon source 241 gases mentioned.

The gas panel 242 can mix a first gas mixture having a first concentration of the etchant 240 and a first concentration of the silicon source gas. The gas panel 242 can mix a second gas mixture 254 having a second concentration of etchant 240 and a second concentration of silicon source gas 241 where the second gas mixture 254 is different from the first gas mixture 252.

In one embodiment, the gas panel 242 can mix a first gas mixture 252 that is a first concentration of HCl 240 and a first concentration of silane gas disposed in the carrier gas 243. The second gas mixture 254 can be mixed in the carrier 243 to include both HCl 240 and silane gases 241 where either HCl or silane is at higher or lower concentrations than in the first gas mixture 252. Additional gases and/or gas mixtures, such as, for example, a third gas or gas mixture 254 and a fourth gas or gas mixture 258, etc. can also be provided by the gas panel 242. The gas panel 242 can supply any of the gas mixtures at different flow rates. The third and fourth gas and/or gas mixtures 256 and 258 can be the same chemistry as the first and/or second gas mixtures 252 and 254 or may use different chemistry or different concentrations of chemistry.

In one embodiment, the first and second gas mixtures 252 and 254, can be directed through the gas inlet manifold 230 and into the upper process chamber 222. The inert gas 243, acting as a purge gas, can be directed through the gas inlet manifold 230 and into the lower process chamber 224. The purge gas 243 may be the same gas as the carrier gas 243. An outlet port 232 can be positioned in the side of the chamber 212 diagonally opposite the inlet manifold 230 and can be adapted to exhaust from the deposition chamber 212, a gas flow that can be a combination of the flow of gas mixtures 298 and the flow 296 and 297 of purge gasses 243.

Heating the susceptor 220 and the preheat ring 228 can be accomplished with a plurality of high intensity lamps 234 that can be mounted around the chamber 212 and where the lamps 234 can be capable of directing light through the upper and lower domes 214 and 216 onto the susceptor 220 and the preheat ring 228. The susceptor 220 and the preheat ring 228 can be made of a material, such as, for example, silicon carbide coated graphite which can be opaque to the radiation emitted from the lamps 234. The opaque material can allow the susceptor 220 and preheat ring 228 to be heated by radiation from the lamps 234. The upper and lower domes 214 and 216 can be made of a material that is transparent to the light from the lamps 234, such as clear quartz. The upper and lower domes 214 and 216 can be made of quartz that is transparent to light in both visible and IR frequencies. The quartz can exhibit a relatively high structural strength and the quartz can be chemically stable in the process environment of the deposition chamber 212. Although using the lamps 234 are one method for heating wafers 213 in the deposition chamber 220, other methods may be used such as resistance heaters and RF inductive heaters (not shown).

An infrared temperature sensor 236 such as a pyrometer can be mounted below the lower dome 216 to face the bottom surface of the susceptor 220 through the lower dome 216. The temperature sensor 236 can be used to monitor the temperature of the susceptor 220 by receiving infrared radiation emitted from the heated susceptor 220. A second temperature sensor 237 for measuring the temperature of the wafer 213 can also be included.

An upper clamping ring 248 can extend around the periphery of the outer surface of the upper dome 214. A lower clamping ring 250 can extend around the periphery of the outer surface of the lower dome 216. The upper and lower clamping rings 248 and 250 can be secured together so as to clamp the upper and lower domes 214 and 216 to the sidewall 218.

The gas inlet manifold 230 can include a connector cap 238, a baffle 274, an insert plate 279 positioned within sidewall 218, and a passage 260 formed between the upper liner 282 and the lower liner 284. The insert plate 279 can be positioned within the process chamber 222 to flow process gases over the wafer top surface. Multiple ports 281 in the insert plate 279 can flow multiple streams of process gasses into the upper process chamber 222 where each stream can be a different mixture of chemistry and/or concentrations of chemistry 252, 254, 256 and 258 and where the streams can flow parallel to each other to pass through areas that are adjacent to and contacting the top surface of the wafer 220. The passage 260 can be connected to the upper portion 222 of chamber 212. Process gasses 240 and 241 and purge gas 243 can flow through the gas cap 238, pass through baffle 274, the insert plate 279, the passage 260, and into the upper portion 222 of the chamber 212.

The inert gas 243 used for purge can be for example, hydrogen ($H_2$) or nitrogen ($N_2$), and can flow into the lower portion 224 of the deposition chamber 212 and where the purge gas inlet 262 can be integrated into the gas inlet manifold 230 as long as a the inert gas 243 is physically separate (from the reactive gases and/or gas mixtures 252, 254, 256 and 258) through the passage 262, through a baffle 274, an insert plate 279, and a lower liner 284. Alternately, the inert purge gas inlet 262 may not be integrated or positioned along with gas inlet manifold 230, but can, for example, be positioned on the reactor 210 at an angle, such as, for example, approximately 90° from the deposition gas inlet manifold 230.

The gas outlet 232 in the reactor 210 can include an exhaust passage 290, which extends from the upper chamber portion 222 to the outside diameter of the sidewall 218. The exhaust passage 290 can include an upper passage 292 formed between the upper liner 282 and the lower liner 284 and which can extend between the upper chamber portion 222 and the inner diameter of the sidewall 218. Additionally, the exhaust passage 290 can include an exhaust channel 294 formed within the insert plate 279 and positioned within the sidewall 218. A vacuum source, such as a pump (not shown), for creating low or reduced pressure in the chamber 212 can be coupled to the exhaust channel 294 on the exterior of the sidewall 218 by an outlet pipe 233. Thus, gasses 243, 252, 254, 256, and 258 that were fed into the upper and lower chamber portions 222 and 224 respectively, can be exhausted through the upper and lower passages 292 and 296 respectively, through the exhaust channel 294 and into the outlet pipe 233.

In one embodiment, the single wafer reactor 210 shown in FIG. 2A can be a "cold wall" reactor, that is, the sidewall 218 and the upper and lower liners 282 and 284 respectively, can be at a substantially lower temperature than the preheat ring 228 and the susceptor 220 (and a wafer 213 placed thereon) during processing. For example, in a process to deposit an epitaxial silicon film on the wafer 213, the susceptor 220 and wafer 213 can be heated to a temperature of approximately in the range of 900–1200° C. while the sidewall 218 (and liners 282 and 284) are at a temperature of approximately in the range of 400–600° C. The sidewall 218 and the liners 282 and 284 can be at a cooler temperature because the sidewall 218 and the liners 282 and 284 may not receive direct irradiation from the lamps 234 due to reflectors 235, and because of the cooling fluid is circulating through the sidewall 218.

The gas outlet 232 can also include a vent 296, which can extend from the lower chamber portion 224 through the lower liner 284 to the exhaust passage 290. The vent 296 may intersect the upper passage 292 of the exhaust passage 294 as shown in FIG. 2A. The purge gas 243 can be exhausted from the lower chamber portion 224 through the vent 296, through a portion of the upper chamber passage 292, through the exhaust channel 294, and into the outlet pipe 233. The vent 296 can allow for the direct exhausting of purge gas 243 from the lower chamber portion 224 to the exhaust channel 294.

In one embodiment, the first and second gas mixtures 252 and 254, can be fed 298 into the upper chamber portion 222 from the gas inlet manifold 230. These process gasses 252 and 254 can act to remove, treat, or deposit silicon onto the wafer 213 or a substrate placed in the chamber 212.

The first gas mixture 252 and the second gas mixture 254, can be used to smooth a silicon surface and to maintain a thickness for the silicon, such as, for example, on the wafer 213. The first and second gas mixtures 252 and 254 can each different concentrations of a mixture of HCl 240, silane 241, and the carrier gas 243, such as, for example $H_2$. The first and second gas mixtures 252, and the wafer 213, can be heated within the process chamber 222 by the lamps 234.

In one embodiment, a process gas can be used to deposit a silicon epitaxial layer on a silicon surface of a wafer 213 placed on the susceptor 220 after the silicon surface has been treated as described above. For this deposition, process gas flow 298 can include a silicon source, such as, for example, monosilane, trichlorosilane, dichlorosilane, and tetrachlorosilane, and a dopant gas source, such as but not limited to phosphine, diborane and arsine. A carrier gas, such as, for example, $H_2$, can be included in the deposition gas stream 298.

For a process chamber 221 with a volume of approximately 5 liters, a deposition process gas stream 298 between 35–75 SLM (including carrier gas) can be fed into the upper chamber portion 222 to deposit a layer of silicon on the wafer 213. The flow of process gas 298 can be essentially a laminar flow from inlet passage 260, across preheat ring 228, across susceptor 220 (and wafer 213), across the opposite side of the preheat ring 228, and out the exhaust passage 290. The process gas 298 can be heated to a deposition or process temperature by the preheat ring 228, the susceptor 220, and the wafer 213 being processed.

In a process to deposit an epitaxial silicon layer on the wafer 213, the susceptor 220 and preheat ring 228 can be heated to a temperature of approximately between 600–1200° C. A silicon epitaxial film can be formed at temperatures as low as 600° C. with silane by using a reduced deposition pressure.

Additionally, while process gas 298 is fed into the upper chamber portion 222, an inert purge gas or gases 299 can be fed independently into the lower chamber portion 224. An inert purge gas 299 can be a gas, which is substantially unreactive at process temperatures with chamber features and wafers placed in the deposition chamber 212. The inert purge gas 299 can be heated by the preheat ring 228 and susceptor 220 to essentially the same temperature as the process gas 298 while in the chamber 212. The inert purge gas 299 can be fed into the lower chamber portion 224 at a rate, which develops a positive pressure within the lower chamber portion 224 with respect to the process gas pressure in the upper chamber portion 222. The process gas 298 is therefore prevented from seeping down through the gap 297 and into the lower chamber portion 224, and depositing on the backside of the susceptor 220.

Figure 2B:
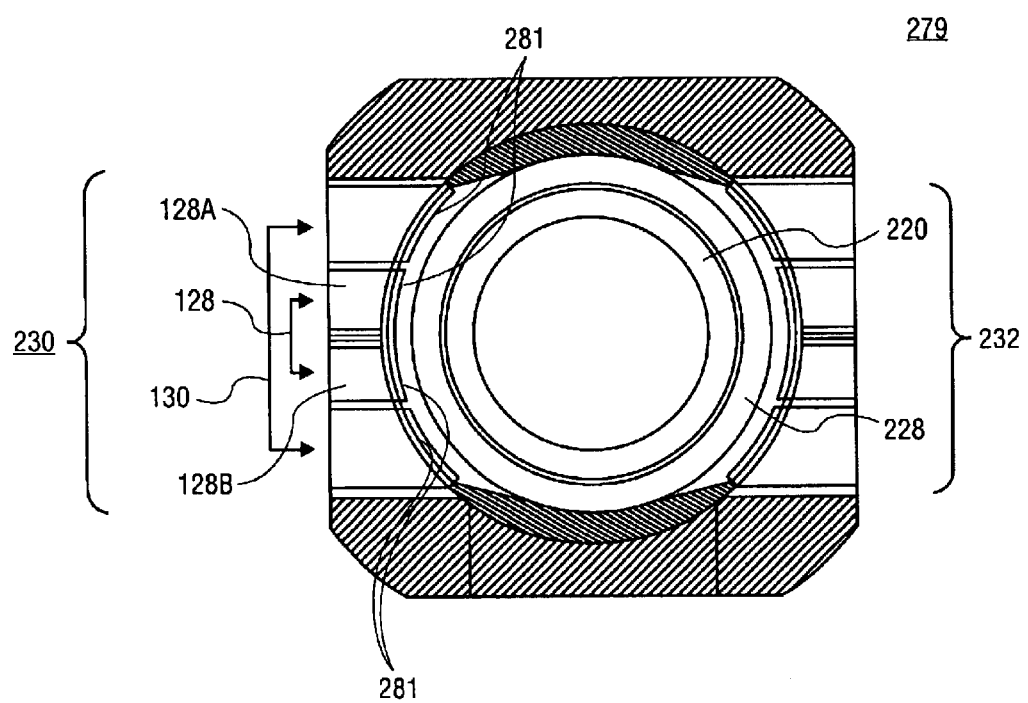
FIG. 2B is a plane view showing how a gas manifold can be divided to enable the formation of different process gas flows for different zones of the wafer.

FIG. 2B is an illustration of one embodiment of an insert plate, which is part of the gas inlet manifold. The gas inlet manifold 230 can supply gas to the upper zone 222 of the processing chamber 221. The insert plate 279 can have an inner zone 128 and an outer zone 130 to apply different gas mixtures, gas mixture concentrations, and flow rates to different areas adjacent to the wafer 213. Using the gas panel 242 (FIG. 2A), the composition and concentration of the process gases, which flow through the inner zone 128 can be controlled independent of the composition of the process gas, which flows through the outer zone 130. In addition, a flow rate and concentration of the gases to either of the two halves 128A or 128B of the inner zone 128 can be further controlled independently from one another. Finally, mixture composition and concentration can be different for gas flows through each of the inner zones 128A and 128B.

The use of these zones 128 and 130 and zone halves 128A and 128B can provide several degrees of control for the purpose of controlling the process over zones of the insert plate 279 and as a result over areas of the exposed surface of a substrate such as for example, the semiconductor wafer 220. In one embodiment, the inner zone 128A and 128B can direct process gas flows onto a first area that is located toward a center of the wafer 220. The outer zone 130 can direct process gas flows onto a second area that is located toward an outer edge of the wafer 220. However, the design and use of more zones than those described above are possible to flow more gas mixtures than are used above.

Returning to FIG. 2A, the processing apparatus 210 can include a system controller 150, which controls various operations of the processing apparatus 210 such as, for example, gas flows, substrate temperature, and chamber pressure. In one embodiment, the system controller 150 can include a hard disk drive (memory 152), a floppy disk drive (not shown) and a processor 154. The processor 154 can contain a single board computer (SBC), analog and digital input/output boards, interface boards and a stepper motor controller board. Various parts of the processing apparatus 210 can conform to the Versa Modular Europeans (VME) standard, which defines board, card cage, and connector dimensions and types. The VME standard also defines the bus structure having a 16-bit data bus and 24-bit address bus.

The system controller 150 can control all of the activities of the processing apparatus 210. The system controller 150 can execute system control software, which is a computer program stored in a computer-readable medium such as a memory 152. Memory 152 can be a hard disk drive, but memory 152 may also be other kinds of memory. The computer program can also include sets of instructions that dictate, for example, the timing, mixture of gases, chamber pressure, chamber temperature, lamp power levels, susceptor position, and other parameters of a particular process. Of course, other computer programs such as one stored on another memory device including, for example, a floppy disk or another appropriate drive, may also be used to operate the controller 150. An input/output device 156 such as a monitor and a keyboard can be used to interface between a user and the controller 150.

The process for smoothing a silicon surface can be implemented using a computer program product, which is stored in the memory 152 and is executed by the processor 154. The computer program code can be written in any conventional computer readable programming language, such as, 68000 assembly language, C, C++, Pascal, Fortran, or others. Suitable program code is entered into a single file, or multiple files, using a conventional text editor, and stored or embodied in a computer usable medium, such as a memory system of the computer. If the entered code text is in a high level language, the code may be compiled, and the resultant compiler code then linked with an object code of precompiled windows library routines. To execute the linked compiled object code, the system user invokes the object code, causing the computer system to load the code in memory, from which the CPU reads and executes the code to perform the tasks identified in the program. Also stored in the memory 152 can be process parameters such as, for example, process gas flow rates (e.g., $H_2$/HCl and $H_2$/silicon source gas flow rates), process temperatures and process pressure necessary to carry out the smoothing of silicon.

Figure 2C:
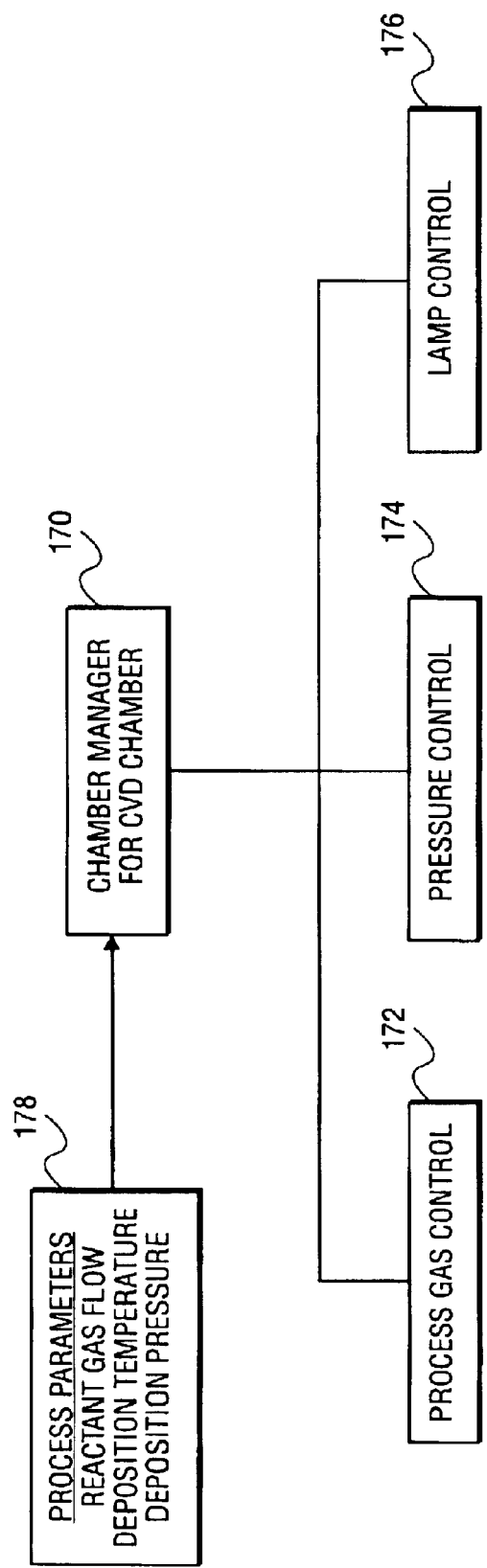
FIG. 2C is an illustration of a system control program which can be used to control the processes and apparatus of FIG. 2A.

FIG. 2C illustrates an example of the hierarchy of the system control computer program stored in memory 152. The system control program can include a chamber manager subroutine 170. The chamber manager subroutine 170 ca also control execution of various chamber component subroutines, which control operation of the chamber components necessary to carry out the selected process set 178. Examples of chamber component instruction sets or subroutines are, for example, the process gas control subroutine 172, the pressure control subroutine 174 and a lamp control subroutine 176. Those having ordinary skill in the art would readily recognize that other chamber control subroutines can be included depending on what processes are desired to be performed in the process chamber 212. In operation, the chamber manager subroutine 170 can selectively schedule or call the process component subroutines in accordance with the particular process set being executed. The chamber manager subroutine 170 can include, for example, operations for monitoring the various chamber components, determining which components need to be operated based on the process parameters for the process set to be executed and causing execution of a chamber component subroutine responsive to the monitoring and determining operations.

The process gas control subroutine 172 can have program code for controlling process gas composition and flow rates. The process gas control subroutine 172 can control such operations as, for example, the open/close position of the safety shut-off valves and also ramping up/down the mass flow controllers to obtain the desired gas flow rates. The process gas control subroutine 172 can be invoked by the chamber manager subroutine 170, as can be all chamber component, subroutines and can receive from the chamber manager, subroutine process parameters related to the desired gas flow rates. The process gas control subroutine 172 can operate by opening the gas supply lines and repeatedly, (i) reading the necessary mass flow controllers 142, (ii) comparing the readings to the desired flow rates received from the chamber manager subroutine 170, and (iii) adjusting the flow rates of the gas supply lines as necessary. Furthermore, the process gas control subroutine 172 can include operations, such as, for example, monitoring the gas flow rates for unsafe rates, and activating the safety shut-off valves when an unsafe condition is detected.

The pressure control subroutine 174 can include program code for controlling the pressure in the process chamber 212 by regulating such operations as, for example, the size of the opening of the throttle valve, thereby controlling the chamber pressure to the desired level in relation to the total process gas flow, the size of the process chamber, and a pumping set point pressure for the exhaust system. The pressure control subroutine 174 can measure the pressure in the process chamber 212 by reading one or more conventional pressure manometers connected to the chamber, comparing the measured value(s) to the target pressure, obtaining PID (proportional, integral, and differential) values from a stored pressure table corresponding to the target pressure, and adjusting the throttle valve according to the PID values obtained from the pressure table. Alternatively, the pressure control subroutine 174 can be written to open or close the throttle valve to a particular opening size to regulate the process chamber 212 to the desired pressure.

The lamp control subroutine 176 comprises program code for controlling the power provided to lamps 234 used to heat the substrate. The lamp control subroutine 176 is also invoked by the chamber manager subroutine 170 and receives a target, or set point, temperature parameter. The lamp control subroutine 176 can measure the temperature by measuring the voltage output of the temperature measurement devices directed at the susceptor 220, compares the measured temperature to the set point temperature, and increases or decreases power applied to the lamps to obtain the set point temperature.

Thus, a method for treating the surface of a silicon or silicon alloy film or substrate has been described. The process is ideally suited to treat the surface of a deposited epitaxial silicon film. The silicon surface to be treated however need not be an epitaxial silicon film and can be, for example, the surface of a monocrystalline silicon substrate, or the surface of an epitaxial silicon alloy such as an epitaxial silicon germanium (SiGe) alloy. Additionally, the silicon film or substrate to be treated can be doped with impurities such as but not limited to arsenic, phosphorus, and boron or can be undoped if desired. Although amorphous and polycrystalline forms of silicon and silicon alloys typically have very rough surfaces which can not be smoothened to the same degree as monocrystalline films and substrates, the surface treatment of the present invention can still be used to improve the surface roughness of amorphous and polycrystalline silicon and silicon alloy films and to improve the surface quality.

Figure 3A:
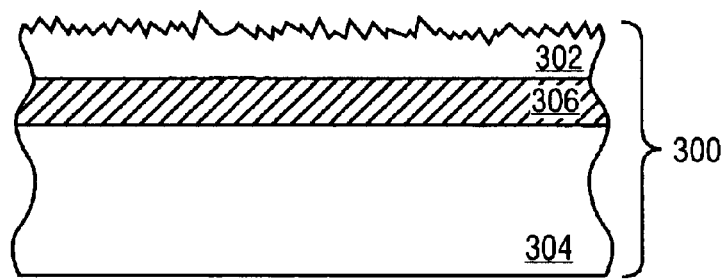
FIG. 3A is an illustration of a cross-sectional view of a substrate having an outer silicon film with a rough surface.

The methods described can be used to treat the surface of any silicon or silicon alloy film or substrate requiring uniform surface smoothing and/or contamination removal with silicon replacement. In a first step, as set forth in block 102 of flow chart 100 in FIG. 1, to treat a silicon or silicon alloy surface, a substrate having a silicon or silicon alloy surface of a silicon film to be treated is placed into a thermal processing chamber such as process chamber 212 of the apparatus 210 shown in FIG. 2A. In one embodiment, the silicon or silicon alloy film to be smoothed can be an epitaxial silicon or silicon alloy having a surface roughness, for example, of at least 0.2 nm RMS and typically at least 0.8 RMS nm as measured by a Digital Instrument Tapping Mode AFM (Atomic Force Microscopy). RMS is the Root Mean Square average of the roughness of the surface. The method and apparatus of can be used to smooth an epitaxial silicon or silicon alloy having an initial surface roughness of, for example, greater than 6 nm RMS. In one embodiment, the substrate to be treated can be a silicon-on-insulator (SOI) substrate such as substrate 300 shown in FIG. 3A. Silicon-on-insulator (SOI) substrate 300 includes a monocrystalline silicon substrate 304. An oxide film 306 is on the monocrystalline silicon substrate 304 and an epitaxial film silicon film 302 is on the oxide film 306.

Next, as set forth in block 104, substrate 300 is heated to a temperature between 700–1300° C. and preferably between 1050–1200° C. Substrate 300 can be heated to the temperature, which is sufficient to cause silicon atoms to migrate. In this way, silicon atoms, which are located at the peaks or high spots of the rough silicon can migrate to the valleys and thereby aid in the smoothing of silicon 302. Substrate 300 can be heated to the selected temperature by heating preheat ring 228, susceptor 220 and substrate 300 with radiation from the lamps 234.

Then, as set forth in block 106 of flow chart 100, a first gas mixture that is a process gas mix comprising reactants HCl and silane disposed in a carrier gas can be fed into the chamber 212 as the substrate 300 is heated to a temperature of approximately between 700–1300° C. The carrier gas can be hydrogen ($H_2$) but other inert gases such as, but not limited to nitrogen ($N_2$), helium (He) and argon (Ar) can be used in place of hydrogen gas. Different concentrations of the reactants, such as with a second gas mixture, third gas mixture, and a fourth gas mixture may be applied, each at a different location over the spinning substrate 300. Additionally, although HCl is described for treating the silicon or silicon alloy surface, other hydrogen bearing etchants such as, for example, HBr, HI and HF may be suitable.

In one embodiment, the first gas mixture (HCl, silane, and $H_2$) can be fed into the chamber 212 having a mix of HCl to $H_2$ that provides a molecular concentration ratio of approximately between 1:100 and 1:10,000. The first gas mixture can be fed into the chamber 212 while the chamber 212 is maintained at approximately atmospheric pressure, however reduced pressures may be utilized. Heat from the susceptor 220, the preheat ring 228, and the substrate 300 placed on the susceptor 220 can cause the thermal disassociation of $H_2$ and HCl which can then react with the silicon film 302 to remove the top portion thereof. Silicon film 302 (FIGS. 3A–3C) can be removed by the first gas mixture at a rate of approximately between 5–80 nm/min.

Figure 4:
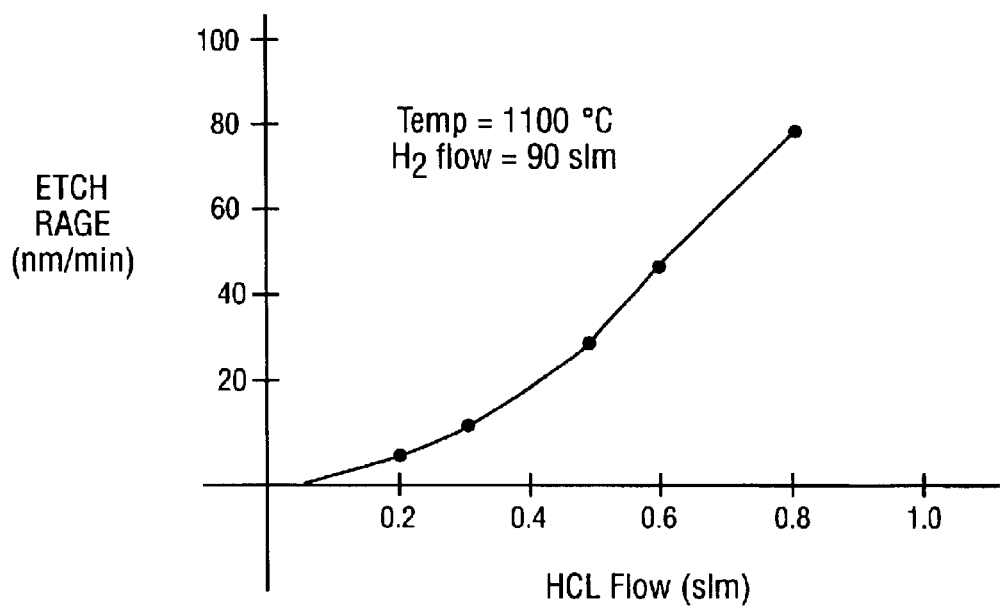
FIG. 4 is a plot which shows how silicon etch rate varies for different $HCl:H_2$ concentration ratios.

The molecular concentration ratio and flow rate of the $H_2$ and HCl determines the removal rate of silicon 302. FIG. 4 illustrates the silicon etch rate (nanometers/minute) of various HCl flow rates in standard liters per minute (SLM) for a constant 90 SLM $H_2$ flow while the substrate 300 is heated to a temperature of approximately 1100° C. As is readily apparent from the graph of FIG. 4, as the HCl:$H_2$ concentration ratio increases the Si removal rate increases. It is to be noted that smoothing on the silicon surface is dependent upon the amount of time the substrate is held at an elevated temperature. That is, since high removal rates use shorter times of etching, the smoothing is not as good. However, if one removes silicon for a long period of time, for example greater than 3 minutes, then both low and high removal rates can generate smooth silicon surfaces. Thus, high removal rates can be used to provide a smooth silicon surface as long as the substrate is exposed to reactants and to high temperatures for a sufficiently long period of time.

In one embodiment where, for example, more than 100 nm of silicon film 302 is to be removed, first a high HCl:$H_2$ molecular concentration ratio is used to provide a high removal rate to remove the bulk of the silicon film, and then the mixture ratio is changed "in process" to a low HCl:$H_2$ molecular concentration ratio to reduce the removal rate towards the end of the treatment process.

Figure 3B:
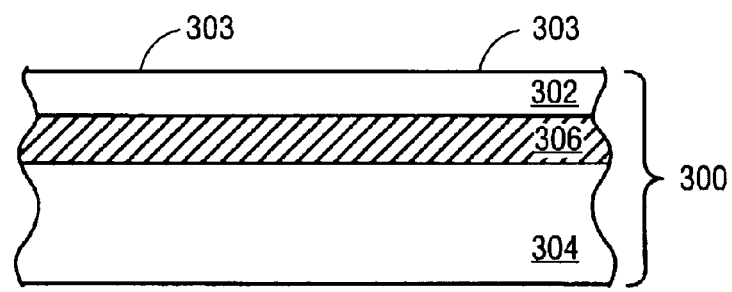
FIG. 3B is an illustration of a cross-sectional view showing a surface treatment of the silicon film on the substrate of FIG. 3A.

The mix of $H_2$ and HCl in the first gas mixture can be continually fed into the process chamber 212 until a sufficiently smooth top surface 303 of silicon film 302 is obtained. In one embodiment, $H_2$ and HCl can be fed into the process chamber 212 until the top surface of the silicon film 302 obtains an RMS value of less than approximately 0.5 nm and preferably less than approximately 0.1 nm, as shown in FIG. 3B. In one embodiment, the silicon film 302 can be treated with the first mixture at a temperature of approximately between 700–1300° C. until less than approximately 100 Å of silicon film 302 remains. It is to be appreciated that the outstanding uniformity of the treatment process enables thin films of less than 100 Å to be formed across the surface of a wafer by a subtractive or removal process.

The removal rate of the silicon film by HCl can be countered by the addition rate of silicon from silane, the silicon source gas, however, when directed to the center of the process chamber 212, the silicon removal/addition rates can be different than the removal/addition rates to the silicon film located at the outer section of the process chamber 212. As such, in one embodiment, the application of the HCl/$H_2$ 240 can be controlled so that the outer zone 130 (FIG. 2B) of the upper chamber portion 222 can receive a flow of the first gas mixture (HCl/$H_2$) while the inner zone 128 (FIG. 2B) of the upper chamber portion 222 can receive a flow of the second gas mixture that does not have as strong a concentration of HCl and/or silane. Thus, the second gas mixture, applied at the inner zone 128 can have a molecular concentration ratio of HCl/$H_2$ and/or silane/$H_2$ that is lower than the molecular concentration ratio of the HCl/$H_2$ and/or silane/$H_2$ in the first gas mixture, i.e. less than 1:10,000 HCl/$H_2$. The molecular concentration ratio of the silane in the first gas mixture can be approximately between, 10:1 and 1:100 (silane gas/carrier gas). The molecular concentration ratio of the silane in the second gas mixture having the molecular concentration ratio that is less than the first gas mixture can be less than 1:100 (silane gas/carrier gas).

Thus, in the one embodiment, the inner zone 128 of process chamber 212 can receive a flow of the second gas mixture 254 that combined have a lower molelcular concentration of at least one of the active ingredients (HCl and/or silane) than in the first gas mixture 252 applied to the outer zone 130.

In another embodiment, the inner zone 128 of the process chamber 212 can receive a molecular concentration of the HCl and/or silane that is more than what is applied to the outer zone 130.

The gas panel 242 can mix the first gas mixture 252 and the second gas mixture 256 and direct the first and second gas mixtures 252 and 254 into the insert plate 279. Using the gas panel 242 and the insert plate inner and outer zones 128A, 128B and 130 (FIG. 2B), any mix combination of first gas mixture 252 and/or second gas mixture 254 can be applied to first and second areas adjacent to the wafer 220. In addition, gas flow through the zones 128 and 130 (including zone halves 128A and 128B) can occur at different flow rates.

When adding silicon, silicon source gasses can be such chemicals as, for example, dichlorosilane (SiCl2H2), trichlorosilane (SiCl3H, silicon tetrachloride SiCl4, silane (SiH4), disilane (Si2H6) and others having an appropriate silicon deposition precursor. These additional silicon atoms can replace silicon being etched and removed by the HCl chemistry. The added silicon atoms can also assist in filling in the valleys of the surface 220 more than the peaks on the surface of the exposed silicon surface, which, along with surface etching, can result in surface smoothing. The added silicon atoms can also assist in maintaining or increased a thickness of a silicon film by adding silicon to replace silicon lost to the HCl chemistry.

Therefore, by varying the chamber 222 temperature, the rate of flow of the process gas mixtures 252, 254, 256 and 258, the ratio of active ingredients in the carrier gas, and the process of directing multiple flows of such gases 252, 254, 256, and 258 over the wafer 220 can act to smooth the surface of the silicone as well as to counter the effects of the etchant. Such a result can include a decrease or an increase in the total silicon thickness or the result can be that the total silicon thickness is the same as before the surface smoothing process began. In any case, the process gas mixtures 252, 254, 256 and 258 can be applied to different areas within the process chamber that are adjacent, i.e. immediately above and contacting, the substrate. This application of gasses 252, 254, 256, and 258 to different locations above the substrate, here the wafer 213, can deposit an etchant and silicon source to fill-in valleys on the silicon substrate surface 220 and to replace silicon lost. This process can improve surface roughness, can reduce, maintain or increase the silicon film thickness, and can do so with increased uniformity in the results.

In one embodiment, the HCl portion of the first gas mixture 252 can flow 298 at a rate of approximately between 50–400 sccm and the dichlorosilane used can flow at a rate of approximately between 20–100 sccm (standard cubic centimeters per minute). The second gas mixture 254 can have flow rates of the HCl and dichlorosilane portions that are different than for the first gas mixture 252. Each gas mixture of etchant 240 and silicon source 241, can be carried by the inert gas 243 such as, for example, $H_2$ where for either the first gas mixture 252 or the second gas mixture 254, the $H_2$ portion of the mixture can flow at a rate of approximately between 10–60 slm (standard liters per minute) into the chamber interior 222 that has been pre-heated to the temperature of approximately 1050–1200 degrees C. and at a chamber pressure of approximately between 15–400 Torr. As mentioned above, the carrier gas 243 can be hydrogen ($H_2$) but other inert gases such as, but not limited to nitrogen ($N_2$), helium (He) and argon (Ar) can be used in place of hydrogen gas.

Figure 3C:
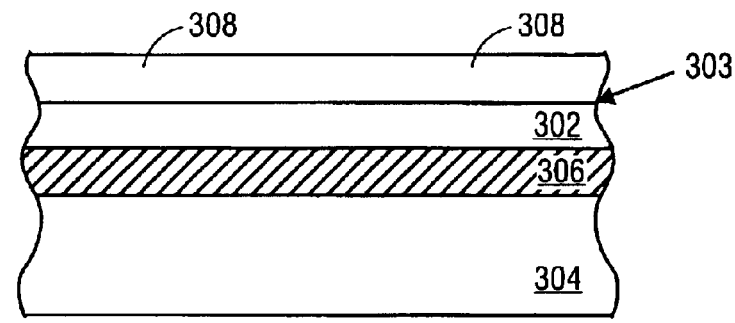
FIG. 3C is an illustration of a cross-sectional view showing the formation of a silicon film on the surface treated silicon film of FIG. 3B.

Next, if desired, as set forth in block 108 of flow chart 100 (FIG. 1), a silicon film 308 (FIGS. 3A–C) can be deposited onto the smooth surface 303 of silicon film 302 as shown in FIG. 3C. In one embodiment, a silicon epitaxial film can be deposited over the silicon film 302 that is exposed to HCl and silicon source gas in $H_2$. Because the surface of the silicon film 302 is smooth and uniform, a subsequent silicon film 308 having a smooth surface can be formed over the silicon film 302.

In one embodiment, an epitaxial silicon film 308 is deposited onto a silicon film 302 in the process chamber 212 (FIG. 2A) in which the surface of the silicon film was made uniformly smooth by the process mentioned above. In this way, a silicon film 308 can be formed directly onto the smooth surface of silicon film 302 without removing the substrate 300 from the process chamber 212 and exposing the silicon film 302 to an oxidizer (e.g. air) or to other potential contaminants.

The deposited silicon film 308 can be doped or undoped and may be an epitaxial silicon. Deposited silicon film 308 can be amorphous or polycrystalline silicon or a silicon alloy such as silicon germanium. Depositing the second silicon film 308 onto the first silicon film 302 enables the formation of a smooth second silicon film having any thickness and any dopant density required. An additional silicon layer can be after the silicon surface treatment process, such that more silicon can be removed during the treatment process than can be replaced by the silicon source gas mixture, and therefore, a suitable surface finish without having to preserve silicon to ensure that a sufficient amount of silicon is available for the formation of devices.

In one embodiment, after the surface smoothing process is complete, a silicon epitaxial film 308 can be formed onto the smooth surface 303 of silicon film 302. A silicon epitaxial film 308 can be formed by heating the substrate 300 to a temperature approximately between 700–1200° C. and flowing a deposition gas comprising a silicon source gas such as but not limited to silane, dichlorosilane, trichlorosilane, etc. and $H_2$ into the chamber 212. If a doped silicon film 308 is used, an n-type dopant, such as phosphine or arsine, or a p-type dopant such as diborane can be included in the gas mix to obtain any dopant conductivity type and density for the silicon film 308.

Figure 5:
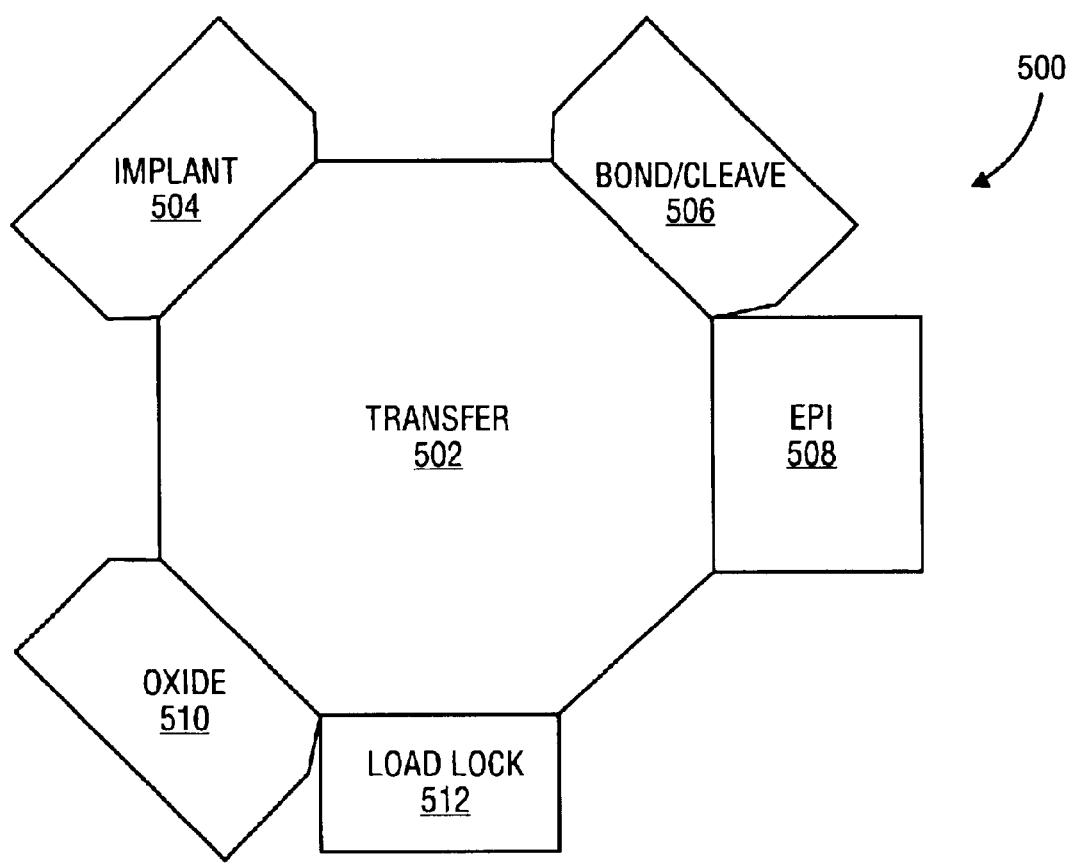
FIG. 5 is an illustration of a cluster tool, which can be used to form a silicon on insulator (SOI) substrate in accordance with an implant and cleave process.

FIGS. 6A–6I illustrate one embodiment where the HCl/silicon source material treatment process of the present invention is used to provide a surface finishing of a silicon film roughened by an implant and cleave process. As illustrated in FIGS. 6A–6I, the implant and cleave process can be used to form a silicon on insulator (SOI) substrate. FIG. 5 is an example of a cluster tool 500 in which the formation of a silicon on insulator substrate in accordance with the present invention can be performed. Cluster tool 500 includes a transfer chamber 502 to which are attached a plurality of different process apparatuses including, an implant chamber 504, a bond/cleave chamber 506, a surface Treatment/Epi chamber 508, such as apparatus 210 shown in FIG. 2A, an oxide formation apparatus 510 and a loadlock 512. Other chambers, such as a cool down chamber or chambers and/or additional loadlocks, can be attached to transfer chamber 502 as required.

Implant chamber 504 is used to implant ions into a donor wafer to form dislocations in the donor substrate to enable the subsequent cleave of the silicon film. Bond/cleave apparatus 506 is used to bond the handle wafer to the implanted donor wafer and is used to cleave the donor wafer from the handle wafer at the implant dislocation. The treatment/Epi chamber 508 is used to treat or smooth the surface of the silicon film after the cleave process and can be used to deposit an epitaxial silicon film on the treated silicon surface. The Treatment/Epi apparatus can also be used to smooth the silicon surface of the donor wafer and to deposit additional silicon thereon if desired. Loadlock 512 is used to transfer wafers or substrates into a transfer chamber 502 of cluster tool 500. Transfer chamber 502 is attached to an exhaust system such as a pump and a source of inert gas, such as nitrogen ($N_2$) so that wafers can be transferred between the various process apparatuses in cluster tool 500 in a reduced pressure ambient or in an inert ambient so that wafers are not exposed to an oxidizing ambient or to sources of contamination. Oxide formation apparatus 510 is used to form an oxide on the donor wafer (or handle wafer if desired). Oxide formation apparatus can be for example, a thermal oxidation apparatus such as a furnace or a rapid thermal processor in which a thermal oxide can be grown on a silicon film. Alternatively, oxide formation apparatus 510 can be a chemical vapor deposition (CVD) apparatus.

In order to form a silicon-on-insulator (SOI) substrate in accordance with one embodiment, a handle wafer 600 and a donor wafer 650 as shown in FIG. 6A are provided. The donor wafer 650 is the wafer (or substrate), which provides a layer or layers to be transferred. The handle wafer 600 is the wafer, which receives the transferred layers from the donor wafer and is the wafer, which will eventually become the silicon on insulator (SOI) substrate. The handle wafer 600 includes a monocrystalline silicon substrate 602. The silicon substrate 602 can be doped to any conductivity type (n-type or p-type) and to any conductivity level selected. In one embodiment, silicon substrate 600 can be a p-type substrate having a doping density of approximately between 1015–1019 atoms/cm3. Handle wafer 600 can also include an oxide film 604 formed thereon. In an embodiment of the present invention Oxide film 604 is between 100–400 nm thick. The oxide film 604 can be thermally grown by exposing silicon substrate 602 to an oxidizing ambient, such as oxygen, at a temperature between 800–1250° C. in the apparatus 510.

The donor wafer 650 includes a monocrystalline silicon substrate 652 with an oxide film 654 formed thereon. The silicon substrate 652 can be doped to any conductivity type and level selected. In one embodiment, silicon substrate 652 can be doped to a level between 1015–1019 atoms/cm3. The oxide film 654 can be formed by thermal layer oxidizing silicon substrate 652 in an oxidizing ambient in the apparatus 510 as described above. The oxide film 654 typically has a thickness between 100–400 nm. Alternatively, to growing an oxide on both donor wafer 650 and handle wafer 600 one can grow an oxide on only the donor wafer 650 or on only the handle wafer 600.

Next, as shown in FIG. 6B, the donor wafer 650 is moved into implant chamber 504 and is implanted with ions to form dislocation 656. The donor wafer 650 can be implanted with hydrogen atoms or with inert ions such argon (Ar) or helium (He). In one embodiment, the donor wafer 650 is ion implanted with a plasma immersion ion implantation process. Such a process can implant high doses of hydrogen $H_2$ into substrate 652. In such a process a high voltage negative bias is applied to donor wafer 650 to accelerate the ions towards the wafer face (oxide layer 654). The plasma immersion ion implantation process implants the entire donor wafer surface. The P-III Ion Implantation System developed by Silicon Genesis can be used for a plasma immersion ion implantation step. Additionally, ion implantation can be carried out using for example beam line ion implantation equipment manufactured by companies such as Applied Materials, Axcelis Corp., Varian and others. In one embodiment, implantation of hydrogen can generate an internal hydrogen rich layer within the donor wafer 650, thereby forming dislocation 656. The depth D, of the ion implantation peak determines the thickness of donor silicon layer 658 which will subsequently be removed from the silicon substrate 652 of the donor wafer 650. In an embodiment, ions are implanted approximately between 100–500 nm into the substrate 652 of the donor wafer 650.

Figure 6D:
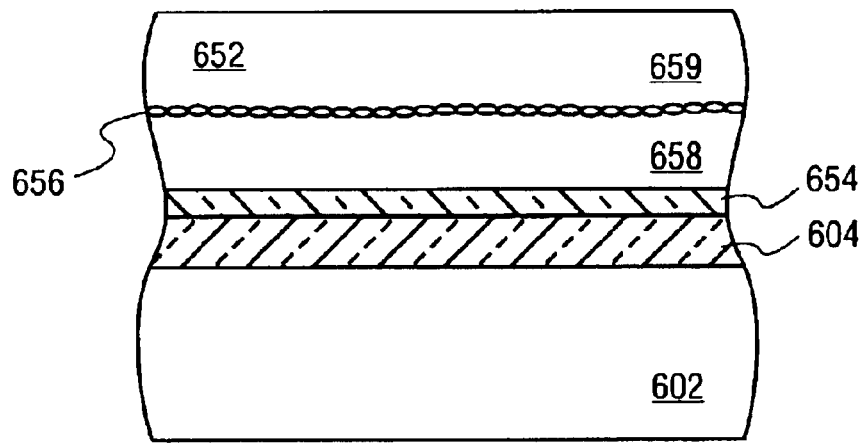
FIG. 6D is an illustration showing the bonding of the donor wafer to the handle wafer.

Next, the ion implanted donor wafer 650 and the handle wafer 600 can be placed into bond/cleave apparatus 506. In the bond/cleave apparatus 506, the donor wafer 650 is bonded to the handle wafer 600 as shown in FIG. 6D. In one embodiment, the oxide 654 of the donor wafer 650 is bonded to the oxide 604 of the handle wafer 600. In one embodiment, the handle and the donor wafers can be bonded using a low temperature plasma activated bond process. By using plasma activation of the bond interface, higher bond strengths can be achieved at low process temperatures (e.g. room temperature). In accordance with one embodiment, both the handle wafer and the donor wafer are exposed to a low temperature plasma as shown in FIG. 6C in order to generate plasma activated bonding interfaces 606 and 653 respectively. It is to be appreciated that other suitable bonding techniques may be used to bond the handle wafer to the donor wafer.

Next, the donor water 650 can be flipped upside-down so that the bond interface 653 can be attached to the bond interface 606 of handle wafer 600 as shown in FIG. 6D. The donor and handle wafer stack can then be compressed together to securely bond the one interface 653 to the other interface 606. Plasma activation of the bond interfaces helps to achieve a sufficiently strong bonding for a subsequent room temperature cleave process. Next, as shown in FIG. 6E, the lower portion 659 of the silicon substrate 652 is separated or cleaved from the silicon substrate 652 at the dislocation 656 of donor wafer 650, leaving the donor silicon layer 658 attached to the handle wafer 600.

In one embodiment, a Room Temperature Controlled Cleaved Process (RT/CCP) can be used to separate the bonded pair at the implant dislocation 656 without using heat. The RT/CCP process can initiate a separation at one point on the wafer and propagates that separation across the entire wafer using mechanical means. In one embodiment, as shown in FIG. 6E a nitrogen stream is focused at the edge of the dislocation to cause separation. The implant, bond, and cleave process can transfer the oxide film 654 and the donor silicon layer 658 to the handle wafer 600. The transfer can generate a silicon-on-insulator (SOI) substrate wafer comprising a silicon wafer 602 with an oxide layer 654/604 buried under a thin donor silicon layer 658 of monocrystalline silicon. The thickness of the top donor silicon layer 658 can be determined by the depth of the hydrogen implant.

Figure 6E:
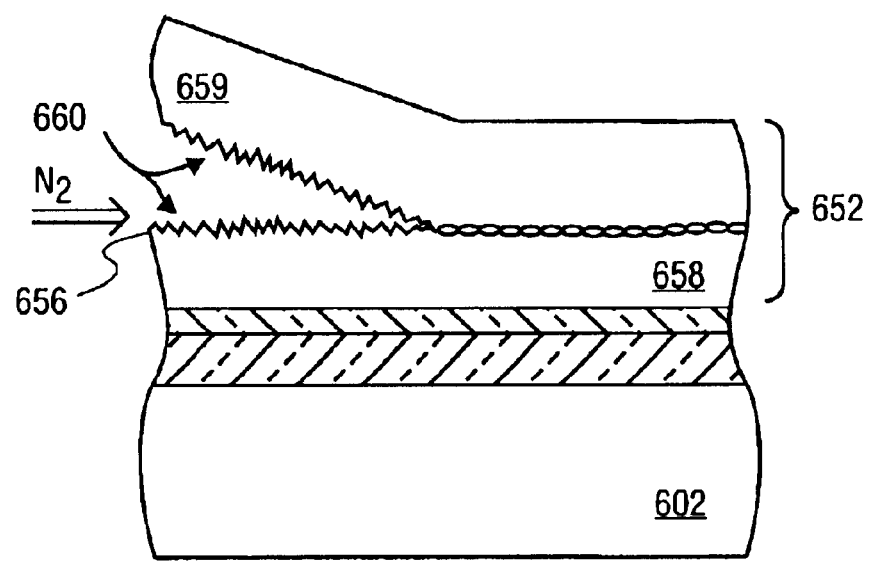
FIG. 6E is an illustration showing the cleaving of a portion of the donor wafer from the handle wafer.
Figure 6F:
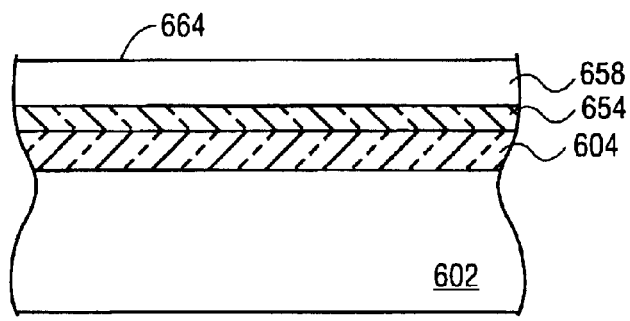
FIG. 6F is an illustration showing the treatment of the top surface of the silicon film formed on the handle wafer.

As shown in FIG. 6E, the implant and cleave process can form a very rough silicon surface 660, where the donor silicon layer 658 is separated from silicon substrate 652. The implant and cleave process can form a silicon surface having a surface roughness of between 2–8 nm RMS. In order to provide a suitable surface finish, the handle wafer 600 along with the oxide 654 and the donor silicon layer 658 can be transferred into the Treatment/Epi chamber 508 and processed as defined in flow chart 100 of FIG. 1 in order to surface treat the rough silicon surface 660 of the donor silicon layer 658 into a suitably smooth surface 664 as shown in FIG. 6F. The donor silicon layer 658 can be suitably treated by heating the handle wafer 600 to a temperature approximately between 700° C.–1300° C. and preferably between 1050° C.–1200° C. and then exposing all or only portions of the donor silicon layer 658 to a first gas mixture of $H_2$, HCl, and silane. In one embodiment, other portions of the donor silicon layer 658 can be exposed to a second gas mixture of $H_2$, HCl, and silane, where the second gas mixture can have different molecular concentration ratios of HCl to $H_2$ and silane to $H_2$ than does the first gas mixture.

In one embodiment, the handle wafer 600 is exposed to the first gas mixture comprising an HCl:$H_2$ molecular concentration ratio of approximately between 1:100 to 1:10,000 and a second gas mixture of dichlorosilane and $H_2$ at a molecular concentration ratio of approximately between 10:1 and 1:100. The handle wafer 600 can be heated and exposed to the first and second gas mixtures until a surface roughness of less than 0.5 nm RMS and preferably less than 0.1 nm RMS is achieved at a predetermined silicon thickness.

In one embodiment, approximately the same donor silicon layer 658 thickness can be maintained while generating a sufficiently smooth surface. In one embodiment, after the donor silicon layer 658 has been sufficiently treated, between 90–300 nm of donor silicon layer 658 can remain.

In one embodiment, the top donor silicon layer 658 can be treated to thin the donor silicon layer 658 to less than 200 Å and preferably between 50–100 Å. Such a thin donor silicon layer 658 can be used to produce a compliant substrate for depositing a relaxed defect free epitaxial silicon germanium film. Additionally, as described above, the molecular concentration ratios in the first and second gas mixtures (both HCl to $H_2$ and silicon source gas to $H_2$) can be varied by the gas panel during smoothing in order to increase or decrease the removal rate or increase the addition of silicon. Further, the first gas mixture and second gas mixture flow rates can be varied across zones over the top surface of the wafer (inner and outer zone locations) in order to manipulate the silicon addition and/or removal rates across the total top surface of the wafer.

Not only does the smoothing process smooth and add silicon to the surface of the donor silicon layer 658 but it also repairs damage and removes contamination caused by the implant/cleave process. For example, the surface treatment process removes hydrogen rich silicon from the surface of donor silicon layer 658. Additionally, the high temperature process used to treat the silicon film can also repair dangling silicon bonds created by the implant and cleave process. Thus, the high temperature treatment processes described alleviates the need for a subsequent high temperature anneal typically used after cleaving.

Figure 6G:
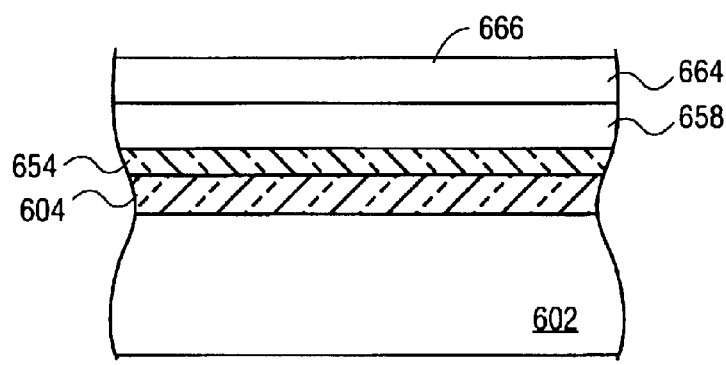
FIG. 6G is an illustration showing the formation of a silicon film on the treated silicon surface of the substrate of FIG. 6F.

Next, as shown in FIG. 6G a top silicon film 666 can be formed on smoothened surface 664 of transferred donor silicon layer 658. In one embodiment, a top silicon film 666 can formed in the same chamber (e.g. chamber 508) in which donor silicon layer 658 was treated. In this way, treated donor silicon layer 658 is not exposed to an oxidizing environment or to other potential contaminants prior to the formation of the top silicon film 666.

In one embodiment, the top silicon film 666 is a single crystalline silicon film (epitaxial silicon) formed by chemical vapor deposition using a silicon source gas, such as trichlorosilane or silane and hydrogen gas. The top silicon film 666 can be formed to any thickness and can be formed to any conductivity type and density. In one embodiment, a top silicon film 666 having p-type conductivity type and a dopant density of approximately between 1015–1019 atoms/cm3 is formed to a total thickness approximately between 1000 Å–5 μm. The ability to do a subtractive and additive process described above in a single chamber can be used to provide a silicon film with any surface finish, thickness, and doping density desired. Alternatively, the top silicon film 666 can be a silicon alloy such as silicon germanium.

Figure 6H:
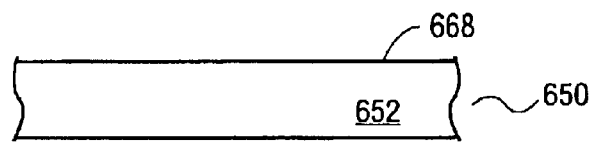
FIG. 6H is an illustration showing the surface treatment of the donor wafer.
Figure 6I:
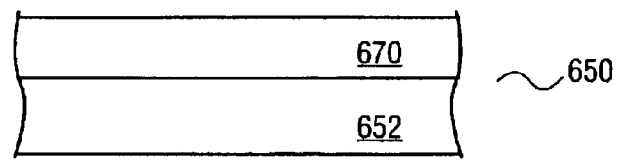
FIG. 6I is an illustration showing the formation of a silicon film on the treated silicon surface of the donor wafer.

Additionally, the donor wafer 650 can be placed into the Treatment/Epi chamber 508 to treat the surface of the silicon substrate 652 and thereby form a smooth contaminant free surface 668 as shown in FIG. 6H. Additional silicon 670, such as epitaxial silicon, can be deposited onto the surface 668 of the donor wafer 650 while the donor wafer 650 remains in the treatment/Epi chamber 508 as shown in FIG. 6I. In this way, additional silicon can be continually added to the donor wafer after each transfer process thereby enabling the regeneration of the silicon film on the donor wafer and enabling a much longer lifetime of the donor. Additionally, growing an epitaxial silicon film on the donor wafer allows one to precisely control the dopant type and density of silicon on the donor wafer. Alternately, the dopant concentration can be changed over the course of the wafer processing. In addition, a silicon alloy such as silicon germanium can be grown on the surface 668 of the donor wafer 650.

To more precisely control and maintain the concentrations of the gas flows entering the chamber, one can add such control mechanisms and methods as are described in the commonly owned, and copending Application titled APPARATUS AND METHOD FOR DELIVERING PROCESS GAS TO A SUBSTRATE PROCESSING SYSTEM, Application No. 10/243,377, filed Sep. 12, 2002 and hereby incorporated by reference.

Thus, a method and apparatus for treating a silicon or silicon alloy surface has been described. Although the disclosure has described embodiments with respect to the treatment of a silicon film of a SOI substrate, and more particularly to a silicon film of a SOI substrate formed by an implant and cleave process, the present invention is not to be limited to these specific embodiments. One skilled in the art will appreciate the ability to use the invention to treat any silicon or silicon alloy surface where a smooth and contaminant free surface is desired.

What is claimed is:

1. A method of treating a silicon surface of a substrate, comprising:

heating the substrate in a process chamber to a temperature;

exposing a first area over the silicon surface to a first gas mixture comprising an etchant, a silicon source gas, and a carrier;

exposing a second area over the silicon surface to a second gas mixture, wherein the second gas mixture is different from the first gas mixture.

2. The method of claim 1, wherein the second gas mixture comprises an etchant, a silicon source gas, and a carrier.

3. The method of claim 2, wherein the etchant in the second gas mixture is the same as in the first gas mixture.

4. The method of claim 2, wherein the silicon source gas in the second gas mixture is the same as in the first gas mixture.

5. The method of claim 2, wherein the silicon source gas is chosen from the group consisting of dichlorosilane ($SiCl_2H_2$), trichlorosilane ($SiCl_3H$), silicon tetrachloride $SiCl_4$, silane ($SiH_4$) and disilane ($Si_2H_6$).

6. The method of claim 2, wherein the etchant is chosen from the group consisting of HCl, HBr, HI and HF.

7. The method of claim 2, wherein the second gas mixture has a lower molecular concentration ratio of etchant to carrier gas than the first gas mixture.

8. The method of claim 2, wherein the second gas mixture has a lower molecular concentration ratio of silicon source gas to carrier than the first gas mixture.

9. The method of claim 2, wherein the second gas mixture has a higher molecular concentration ratio of etchant to carrier gas than the first gas mixture.

10. The method of claim 2, wherein the second gas mixture has a higher molecular concentration ratio of silicon source gas to carrier than the first gas mixture.

11. The method of claim 1, further comprising exposing a third area and a fourth area over the silicon surface with a third gas mixture and a fourth gas mixture respectively.

12. The method of claim 1, wherein the temperature is in the range of approximately 700°–1300° C.

13. The method of claim 1, wherein the temperature is in the range of approximately 1050°–1200° C.

14. The method of claim 1, further comprising:

increasing a silicon film thickness that forms the silicon surface.

15. The method of claim 1, further comprising:

maintaining the silicon film thickness.

16. The method of claim 1, wherein the silicon surface is exposed to the first gas mixture and the second gas mixture until the silicon surface has a surface roughness of less than 0.1 nm RMS.

17. The method for claim 1, wherein the silicon surface is exposed to the first gas mixture and the second gas mixture until the silicon surface has a surface roughness of less than 0.005 nm RMS.

18. The method of claim 1, wherein the carrier gas is chosen from the group consisting of hydrogen ($H_2$), nitrogen ($N_2$), helium (He) and argon (Ar).

19. The method of claim 1, wherein a pressure within the process chamber, during processing, is atmospheric pressure.

20. The method of claim 1, wherein the first gas mixture contains HCl as the etchant with a molecular concentration ratio of HCl to $H_2$ of approximately between 1:100 and 1:10,000.

21. The method of claim 1, wherein the first gas mixture contains silane as the silicone source gas with a molecular concentration ratio of silane to $H_2$ of approximately between 10:1 and 1:100.

22. The method of claim 1, wherein the silicon surface is a silicon or silicon alloy film formed on an oxide film formed on a single crystalline silicon substrate.

23. The method of claim 1, wherein a film thickness forming the silicon surface is determined by varying process parameters chosen from the group consisting of a flow rate of the first gas mixture, a flow rate of the second gas mixture, a flow rate of the third gas mixture, a flow rate of the fourth gas mixture, process chamber temperature, process chamber pressure; and first, second, third, and fourth gas mixture compositions.

24. A machine-readable medium having stored thereon instructions, which when executed performs the method of claim 1.

25. A method of treating a silicon surface on a substrate, comprising:

heating the substrate to a temperature of approximately between 700°–300° C.;

applying onto a first area over the silicon surface;
 a first gas mixture comprising HCl and silane in a $H_2$ carrier gas, applying onto a second area over the silicon surface;
 a second mixture comprising HCl and silane in a $H_2$ carrier gas;
 varying flow rates for the first gas mixture and the second gas mixture with a gas panel; and
 varying molecular concentration ratios of the first gas mixture and the second gas mixture throughout the substrate processing with the gas panel.

26. The method of claim 25, wherein the substrate is a silicon-on-insulator substrate, the substrate is heated to a temperature of approximately between 1050° C.–1200° C., a molecular concentration ratio of HCl to $H_2$ in the first gas mixture is approximately between 1:100 and 1:1000, and a molecular concentration ratio of silicon source gas to $H_2$ is approximately between 10:1 and 1:100.

27. A method for treating a film, comprising:

providing a process chamber with an insert plate having an inner and an outer zone;

placing a substrate adjacent to the insert plate where the substrate comprises a cleaved surface, the cleaved surface being characterized by a predetermined surface roughness value and having a distribution of hydrogen bearing particles defined from the cleaved surface to a region underlying the cleaved film;

increasing a temperature of the cleaved surface to greater than 1,000° C.;

flowing a first gas mixture that is HCl and silane in a carrier gas to the outer zone over the cleaved surface;

flowing a second gas mixture that is a different gas mixture than the first gas mixture to the inner zone over the cleaved surface; and continuing to flow the first gas mixture and the second gas mixture until a surface roughness value of the cleaved surface is reduced by at least fifty percent.

28. The method of claim 27 wherein the carrier gas is hydrogen gas.

29. The method of claim 27, wherein the first gas mixture has a molecular concentration ratio of HCl to carrier gas that is approximately between 1:100 and 1:10,000.

30. The method of claim 27 wherein the first gas mixture has a molecular concentration ratio of silane gas to carrier gas that is approximately between 10:1 and 1:100.

31. The method of claim 27 wherein the substrate is maintained at approximately 1 atmosphere during the application of the process gases.

32. The method of claim 27, wherein the cleaved surface is provided by a controlled cleave process.

33. The method of claim 27, wherein the second gas mixture has HCl in a carrier gas with a molecular concentration ratio that is lower than for the first gas mixture.

34. The method of claim 27, wherein the second gas mixture has silane in a carrier gas with a molecular concentration ratio that is lower than for the first gas mixture.

35. The method of claim 27, further comprising:

a flow of the first gas mixture into the process chamber through an outer zone of the insert plate is different than for a flow of the second mixture through an inner zone of the insert plate.

36. The method of claim 35, wherein flow through one half of the inner zone is different than for the other half of the inner zone.

37. The method of claim 35, wherein the inner zone has a lower gas flow rate than does the outer zone.

38. The method of claim 35, wherein the outer zone has a higher gas flow rate than does the inner zone.

* * * * *